(12) United States Patent
Smorenburg et al.

(10) Patent No.: US 11,223,181 B2
(45) Date of Patent: Jan. 11, 2022

(54) HIGH HARMONIC GENERATION RADIATION SOURCE

(71) Applicant: ASML Netherlands B.V., Veldhoven (NL)

(72) Inventors: Petrus Wilhelmus Smorenburg, Veldhoven (NL); Gerrit Jacobus Hendrik Brussaard, Boxtel (NL); David O Dwyer, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/543,964

(22) Filed: Aug. 19, 2019

(65) Prior Publication Data

US 2020/0067258 A1 Feb. 27, 2020

(30) Foreign Application Priority Data

Aug. 21, 2018 (EP) .................................... 18189877

(51) Int. Cl.
*H01S 3/109* (2006.01)
*G01N 21/956* (2006.01)
(Continued)

(52) U.S. Cl.
CPC ........... *H01S 3/109* (2013.01); *G01N 21/956* (2013.01); *G03F 7/202* (2013.01); *G02F 1/354* (2021.01)

(58) Field of Classification Search
CPC ....... H01S 3/109; G01N 21/956; G03F 7/202; G02F 2001/354; H05G 2/00
(Continued)

(56) References Cited

U.S. PATENT DOCUMENTS 6,952,253 B2   10/2005   Lof et al.
10,209,627 B2   2/2019   Lee et al.
(Continued)

FOREIGN PATENT DOCUMENTS

TW    2018-41064 A   7/2018

OTHER PUBLICATIONS

Kandula, et al "XUV frequency comb metrology on the ground state of helium" ARXIV.org, Cornell University Library, XP080527745 DOI: 10.1103/PHYSREVA.84.062512, Sep. 15, 2011 (Year: 2011).*

(Continued)

*Primary Examiner* — Michael Maskell
(74) *Attorney, Agent, or Firm* — Sterne, Kessler, Goldstein & Fox P.L.L.C.

(57) ABSTRACT

Methods and corresponding apparatus operable to cause an interaction between a drive radiation beam and a medium for generation of emitted radiation by high harmonic generation, the arrangement comprising: an interaction region positioned at an interaction plane and configured to receive the medium; a beam block positioned upstream of the interaction plane at a beam block plane and configured to partially block the drive radiation beam; a beam shaper positioned upstream of the beam block plane at an object plane and configured to control a spatial distribution of the drive radiation beam; and at least one lens positioned upstream of the interaction plane and downstream of the beam block plane, wherein the lens being positioned such that an image of the spatial distribution of the drive radiation beam is formed at the interaction plane.

19 Claims, 7 Drawing Sheets

(51) Int. Cl.
*G03F 7/20* (2006.01)
*G02F 1/35* (2006.01)

(58) Field of Classification Search
USPC .................................... 250/504 R; 372/22
See application file for complete search history.

(56) References Cited

U.S. PATENT DOCUMENTS

| | | |
|---|---|---|
| 2007/0224518 A1 | 9/2007 | Yokhin et al. |
| 2013/0304424 A1 | 11/2013 | Bakeman et al. |
| 2014/0019097 A1 | 1/2014 | Bakeman et al. |
| 2016/0282282 A1 | 9/2016 | Quintanilha et al. |
| 2017/0082845 A1* | 3/2017 | Chen .................. G02B 21/0048 |
| 2017/0184511 A1* | 6/2017 | Den Boef ............. G03F 9/7065 |
| 2017/0184981 A1 | 6/2017 | Quintanilha et al. |
| 2017/0241920 A1* | 8/2017 | Barty ....................... G21K 1/02 |
| 2018/0224753 A1* | 8/2018 | Mathijssen ......... G03F 7/70625 |

OTHER PUBLICATIONS

Kandula, et al "XUV frequency comb metrology on the ground state of helium" Arxiv.org, Cornell University Library, XP080527745 DOI: 10.1103/PHYSERVA.84.062512, Sep. 15, 2011 (Year: 2011).*
International Search Report and Written Opinion of the International Searching Authority directed to related International Patent Application No. PCT/EP2019/068549, dated Nov. 14, 2019; 16 pages.
Dominik Z. Kandula, et al. XUV Frequency Comb Metrology on the Ground State of Helium, Laser LaB Amsterdram (Sep. 16, 2011).
R. Klas, et al. Annular Beam Driven High Harmonic Generation for High Flux Coherent XUV and Soft X-Ray Radiation, Optics Express, vol. 26, No. 15 (Jul. 23, 2018).
J. Peatross, et al., High-order Harmonic Generation with an Annular Laser Beam, Optics Letters, vol. 19, No. 13 (Jul. 1, 1994).

* cited by examiner

HIGH HARMONIC GENERATION RADIATION SOURCE

FIELD

The invention relates to methods and apparatus for implementing a radiation source for generation of radiation using High Harmonic Generation (HHG). More specifically, the invention may relate to methods and apparatus for controlling an amount of a drive radiation that escapes the radiation source. The invention may also relate to methods and apparatus for inspection (e.g., metrology) usable, for example, in the manufacture of devices by lithographic techniques using/including such a radiation source.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD=k_1 \times \lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low k1.

As explained below, an inspection apparatus, which may also be referred to as a metrology tool, may be used to determine properties of substrates and features fabricated on substrates, and in particular, how properties of different substrates vary or how properties associated with different layers of the same substrate vary from layer to layer. Such inspection apparatus may expose the substrate and the associated features to radiation and capture scattered or diffracted radiation to form images permitting the determination of the properties of the substrates and/or the features. The radiation may comprise soft x-ray (SXR) and/or EUV radiation.

Soft x-ray (SXR) and/or EUV radiation has a wavelength extending roughly from 0.1 nm to 100 nm. Applications of SXR and/or EUV include, but are not limited to, current or near-future measurement tools for the semiconductor industry, e.g. where visible light is starting to give insufficient spatial resolution for the continuously shrinking feature sizes.

SXR and/or EUV radiation may be generated using HHG, in which, for example, an intense laser pulse of visible or infrared (IR) drive radiation interacts with a gaseous medium, leading to emission of SXR and/or EUV by the gas atoms due to their interaction with the drive radiation. The HHG-generated SXR and/or EUV light may then be focused onto a target on the wafer by means of an optical column that transfers the light from the HHG source to the target. The reflected light may be detected and processed to infer properties of the target.

SUMMARY

For the applicability of an SXR and/or EUV metrology tool it is desirable to focus the SXR and/or EUV beam into a very small spot on the customer wafer. This is because usually only very little real estate on the wafer is available for printing metrology targets. For many exemplary use cases, the SXR and/or EUV spot should be smaller than 5 μm in diameter. This is a significant challenge which requires, amongst other things, a well-behaved and well-focusable SXR and/or EUV beam generated by the HHG source. The focusability of an SXR and/or EUV beam is determined by properties including beam divergence, intensity distribution of the emitted SXR and/or EUV, and beam aberrations, or more generally, by the wavefront of the SXR and/or EUV beam.

However, the inventors have appreciated that the atomic HHG mechanism is such that the SXR and/or EUV wavefront is for a large part determined by an intensity distribution of the drive radiation in the gas target. Therefore, the inventors have realised that control over and optimization of the focusability of the SXR and/or EUV beam, which increases the ability to implement an SXR and/or EUV metrology tool, depends at least in part on the control one has over the intensity distribution of the drive laser in the gas target.

Typically in existing HHG sources, the drive radiation is focused down to a spot in the target with Gaussian intensity distribution. Within the limitations of a gaussian spot, one has some rough control of the SXR and/or EUV wavefront by optimizing the drive laser focal spot size and/or the target position with respect to the focal point. However, the inventors have appreciated that more detailed control of the SXR and/or EUV wavefront may be achieved if one is not limited to a gaussian distribution but instead is able to tailor a custom intensity distribution of the drive radiation. For example, a different intensity distribution may yield superior SXR and/or EUV wavefront properties. Technologies do exist to manipulate the focal spot distribution of a laser. In particular, the laser beam may be manipulated by deformable mirrors and spatial light modulators (SLMs) upstream of a lens that focuses the beam to a spot.

Further, in an HHG radiation source, the SXR and/or EUV beam (emitted radiation beam) is emitted in the same direction as the drive laser beam. The drive radiation needs to be separated from the SXR and/or EUV beam to prevent it interfering with the measurements. Additionally, the relatively high power drive radiation needs to be blocked in some way to prevent it from entering the sensitive optical column or being transmitted to the sensitive customer wafer.

Typically in existing HHG sources, blocking of the drive laser is done by means of a thin metal foil that is partially transmissive to SXR and/or EUV. However, this method is not applicable to high-power HHG sources because such a filter cannot withstand high drive radiation power. An alternative method has been proposed (Peatross et al., Opt. Lett. 19, 942 (1994)) in which the central part of the drive laser beam is blocked by a beam block. The resulting annular beam still makes a generally Gaussian central spot at the focal point in the target, thus not affecting the generation of SXR and/or EUV significantly, but will evolve again into an annular beam downstream of the target. The drive laser may then be blocked by an aperture configured to allow the emitted SXR and/or EUV beam to pass through, whereas the annular drive radiation beam is blocked. This is explained later with reference to FIG. 5b.

The inventors have realised that improved solutions to one or more of the problems specified herein or otherwise known by a skilled person are desirable. In some arrangements, methods and apparatus may seek to solve or mitigate the above two problems simultaneously. In exemplary arrangements, problems associated with the separation of the drive radiation and emitted radiation (SXR and/or EUV beam) may be solved or mitigated by applying beam manipulation techniques to control the intensity distribution of the drive radiation beam, for example using a beam shaper such as an SLM. Problems associated with blocking the drive radiation at the output of the radiation source may be solved or mitigated by blocking the central part on the laser beam.

However, the inventors have realised that solutions to both of the above problems may, in general, interfere with each other. That is, laser beam distribution that is prepared upstream by an SLM, for example, would be modified by a beam block arranged to form an annular drive radiation beam, leading to an intensity distribution at the target other than the desired one. Conversely, the annular beam property that should result from the beam block will be affected by the beam manipulations of the SLM, leading to leakage of drive radiation through the downstream aperture. Exemplary optical setups are proposed herein that circumvent this problem by making use of the imaging properties of a lens system.

According to the invention in an aspect there is provided a radiation source arrangement operable to cause an interaction between a drive radiation beam and a medium for generation of emitted radiation by high harmonic generation, the arrangement comprising: an interaction region positioned at an interaction plane and configured to receive the medium; a beam block positioned upstream of the interaction plane at a beam block plane and configured to partially block the drive radiation beam; a beam shaper positioned upstream of the beam block plane at an object plane and configured to control a spatial distribution of the drive radiation beam; and at least one lens positioned upstream of the interaction plane and downstream of the beam block plane, wherein the lens is positioned such that an image of the spatial distribution of the drive radiation beam is formed at the interaction plane.

Optionally, the lens is positioned such that the object plane and the interaction plane are conjugate planes.

Optionally, the arrangement further comprises an aperture positioned downstream of the interaction plane at an aperture plane and configured to allow at least part of the emitted radiation to pass through and to block at least part of the drive radiation beam.

Optionally, the aperture plane is positioned with respect to the beam block plane and the lens such that an image of the beam block is formed at the aperture plane.

Optionally, the lens is positioned such that the beam block plane and the aperture plane are conjugate planes.

Optionally, a dimension of the beam block in the beam block plane relative to a dimension of the drive radiation beam in the beam block plane is such that the image of the beam block and the image of the spatial distribution of the drive radiation beam are decoupled.

Optionally, the dimension of the beam block in the beam block plane is 30% or less of the dimension of the drive radiation beam in the beam block plane.

Optionally, the beam block and the drive radiation beam have substantially circular cross sections in the beam block plane, and wherein the dimensions of the beam block and the drive radiation beam are diameters.

Optionally, a depth of focus of the image of the beam block does not overlap the interaction plane.

Optionally, a centre of the depth of focus of the image of the beam block is substantially coincident with the aperture plane.

Optionally, a circle of confusion associated with the depth of focus of the image of the beam block is larger than the image of the drive radiation beam at the interaction plane.

Optionally, the depth of focus of the image of the beam block has a maximum circle of confusion having a diameter of 35 μm or less.

Optionally, a depth of focus of the image of the spatial distribution of the drive radiation beam does not overlap the aperture plane.

Optionally, a centre of the depth of focus of the image of the intensity distribution of the drive radiation beam is substantially coincident with the interaction plane.

Optionally, the depth of focus of the image of the beam block and/or the depth of focus of the image of the spatial distribution of the drive radiation beam is determined by $$\text{Depth of focus} = 2cN(1+m)$$

where c is a maximum circle of confusion, N is a ratio of focal length of the lens to a diameter of the drive radiation beam at the lens and m is a magnification factor of the image of the beam block at the aperture plane.

Optionally, the beam shaper comprises a spatial light modulator positioned at the object plane.

Optionally, the arrangement further comprises a sensor configured to detect a spatial profile of the drive radiation beam at the interaction plane; and a feedback controller configured to feedback data relating to the detected spatial profile of the drive radiation beam to the spatial light modulator, wherein the spatial light modulator is configured to control the spatial profile of the drive radiation beam based on the data fed back.

According to the invention in an aspect there is provided a metrology apparatus comprising the arrangement according to any above or disclosed herein.

According to the invention in an aspect there is provided a lithographic cell comprising a arrangement discussed above or described elsewhere herein, or a metrology apparatus mentioned above or described elsewhere herein.

According to the invention in an aspect there is provided a method of causing an interaction between a drive radiation beam and a medium, for generation of emitted radiation by high harmonic generation, the method comprising: blocking the drive radiation beam by a beam block such that at least part of the drive radiation beam is blocked; propagating the drive radiation beam through at least one lens positioned downstream of the beam block; impinging the drive radiation beam on an interaction region comprising the medium and positioned downstream of the beam block; and focussing the drive radiation at an aperture positioned downstream of the interaction region at an aperture plane such that an image of the beam block is formed at the aperture plane, the aperture being configured to allow at least part of the emitted radiation to pass through and to block at least part of the drive radiation beam.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
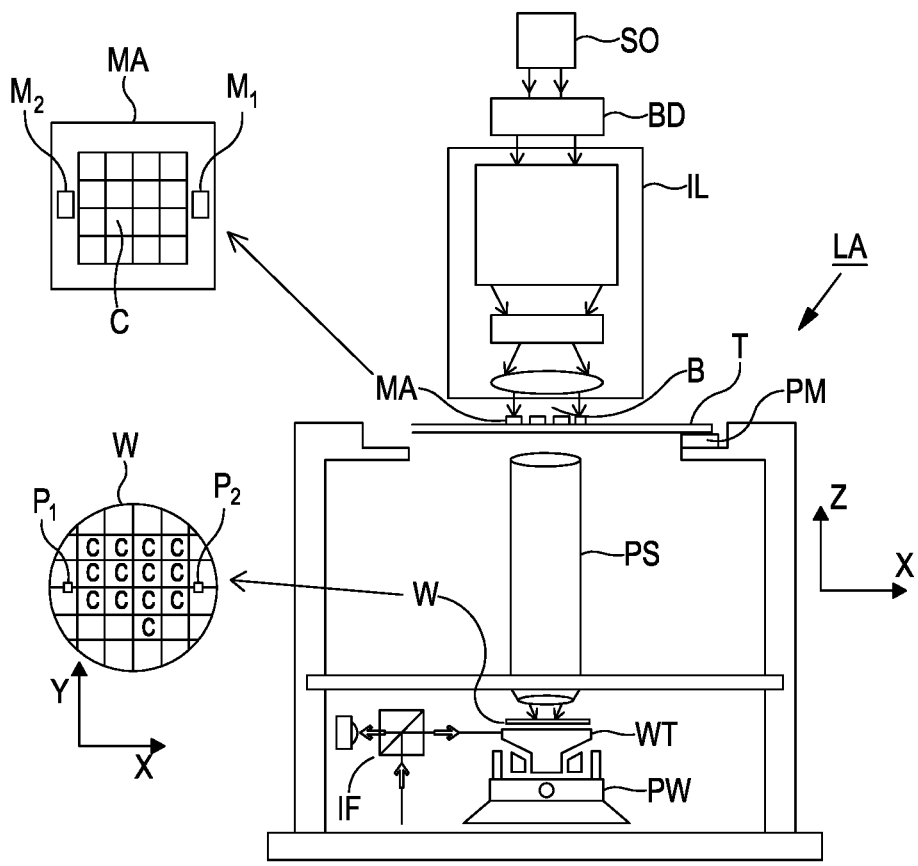
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
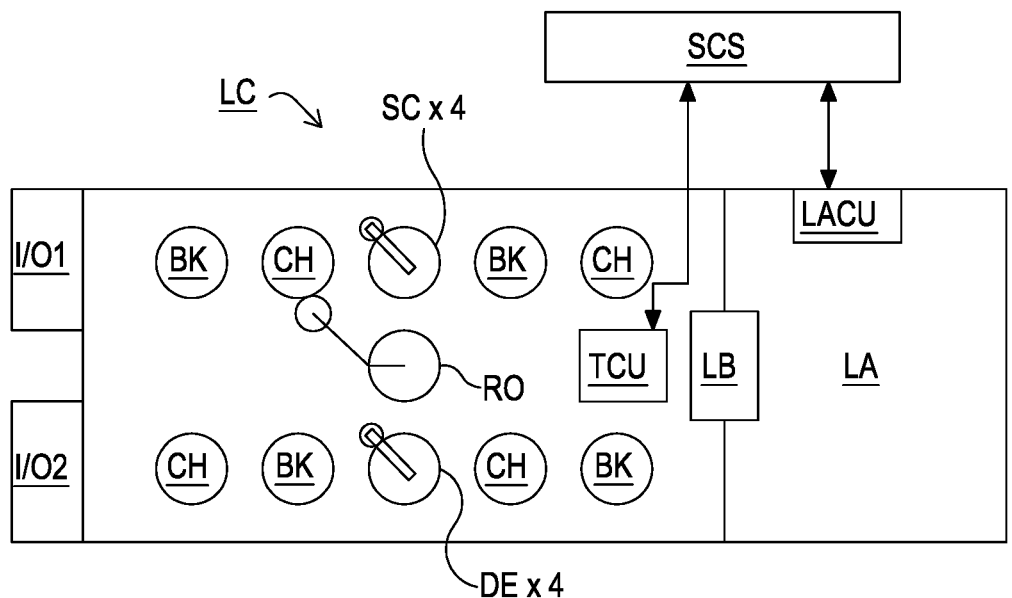
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer.

The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
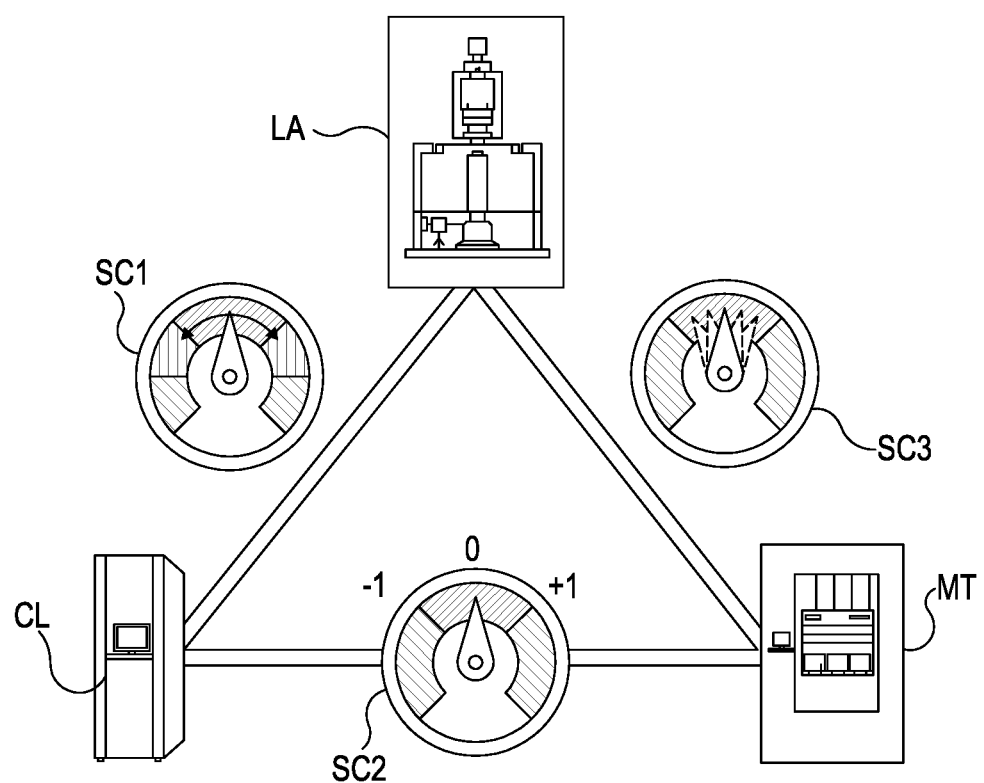
FIG. 3 depicts a schematic representation of holistic lithography, representing a cooperation between three key technologies to optimize semiconductor manufacturing.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MT (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MT) to predict whether defects may be present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

As an alternative to optical metrology methods, it has also been considered to use soft X-rays or EUV radiation, for example radiation in a wavelength range between 0.1 nm and 100 nm, or optionally between 1 nm and 50 nm or optionally between 10 nm and 20 nm. One example of metrology tool functioning in one of the above presented wavelength ranges is transmissive small angle X-ray scattering (T-SAXS as in US 2007224518A which content is incorporated herein by reference in its entirety). Profile (CD) measurements using T-SAXS are discussed by Lemaillet et al in "Intercomparison between optical and X-ray scatterometry measurements of FinFET structures", Proc. of SPIE, 2013, 8681. Reflectometry techniques using X-rays (GI-XRS) and extreme ultraviolet (EUV) radiation at grazing incidence are known for measuring properties of films and stacks of layers on a substrate. Within the general field of reflectometry, goniometric and/or spectroscopic techniques can be applied. In goniometry, the variation of a reflected beam with different incidence angles is measured. Spectroscopic reflectometry, on the other hand, measures the spectrum of wavelengths reflected at a given angle (using broadband radiation). For example, EUV reflectometry has been used for inspection of mask blanks, prior to manufacture of reticles (patterning devices) for use in EUV lithography.

It is possible that the range of application makes the use of wavelengths in the soft X-rays or EUV domain not sufficient. Therefore published patent applications US 20130304424A1 and US2014019097A1 (Bakeman et al/KLA) describe hybrid metrology techniques in which measurements made using x-rays and optical measurements with wavelengths in the range 120 nm and 2000 nm are combined together to obtain a measurement of a parameter such as CD. A CD measurement may be obtained by using an x-ray mathematical model and/or an optical mathematical model. The contents of the cited US patent applications are incorporated herein by reference in their entirety.

Figure 4:
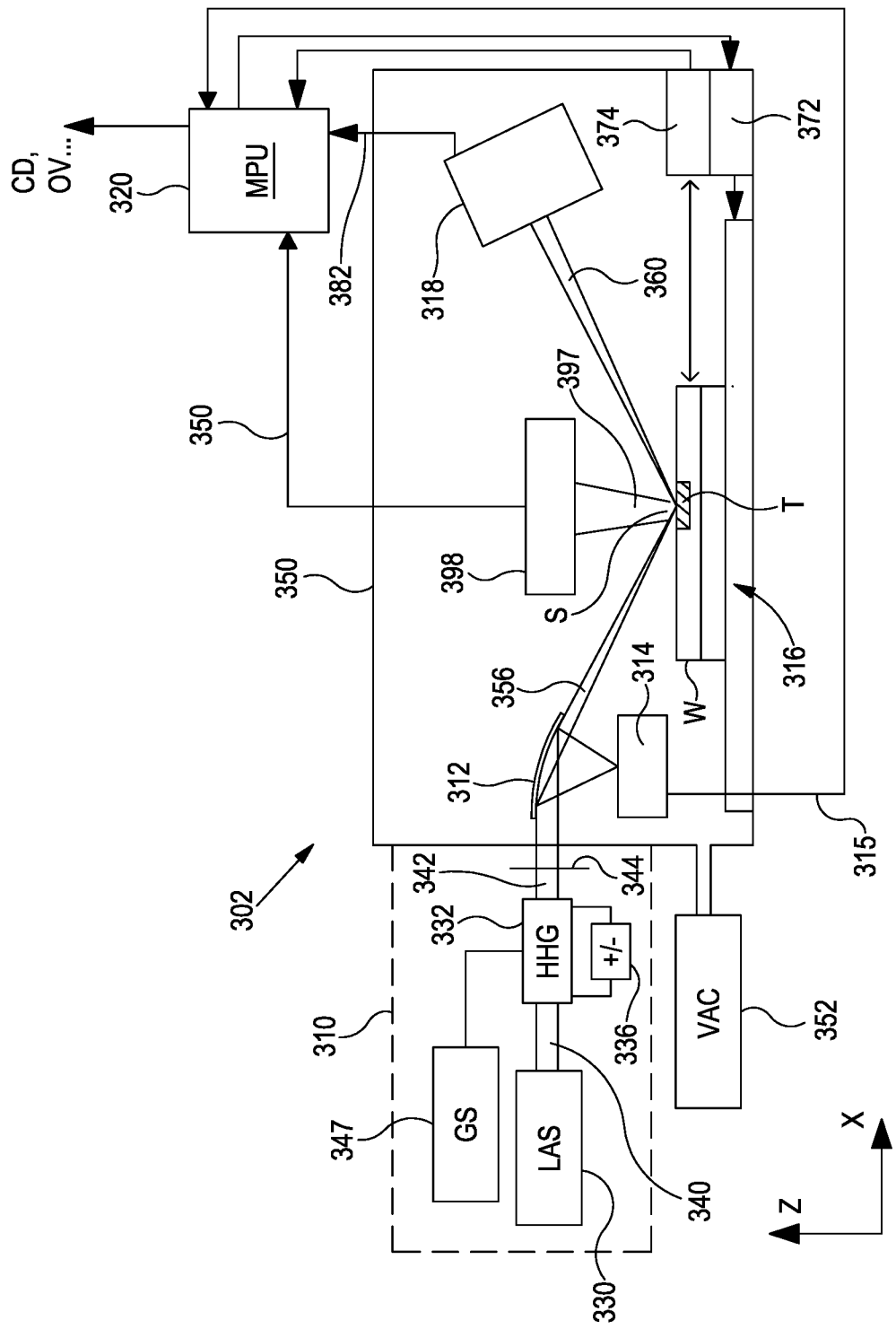
FIG. 4 depicts a schematic representation of a metrology apparatus.

FIG. 4 depicts a schematic representation of a metrology apparatus 302 in which radiation in the wavelength range from 0.1 nm to 100 nm may be used to measure parameters of structures on a substrate. The metrology apparatus 302 presented in FIG. 4 is suitable for the soft X-rays or EUV domain.

FIG. 4 illustrates a schematic physical arrangement of a metrology apparatus 302 comprising a spectroscopic scatterometer using EUV and/or SXR radiation in grazing incidence, purely by way of example. An alternative form of inspection apparatus might be provided in the form of an angle-resolved scatterometer, which uses radiation in normal or near-normal incidence similar to the conventional scatterometers operating at longer wavelengths.

Inspection apparatus 302 comprises a radiation source 310, illumination system 312, substrate support 316, detection systems 318, 398 and metrology processing unit (MPU) 320.

Source 310 in this example comprises a generator of EUV or soft x-ray radiation based on high harmonic generation (HHG) techniques. Main components of the radiation source are a drive laser 330, for producing drive radiation, and an HHG gas cell 332. A gas supply 334 supplies suitable gas target (or medium) to the gas cell, where it is optionally ionized by an electric source 336. The drive laser 300 may be, for example, a fiber-based laser with an optical amplifier, producing pulses of infrared radiation that may last for example less than 1 ns (1 nanosecond) per pulse, with a pulse repetition rate up to several megahertz, as required. The wavelength of the infrared drive radiation may be for example in the region of 1 μm (1 micron). The laser pulses are delivered as a first radiation beam 340 to the HHG gas cell 332, where in the gas a portion of the radiation is converted to higher frequencies than the first radiation into a beam 342 including coherent second (or emitted) radiation of the desired wavelength or wavelengths.

The second radiation may contain multiple wavelengths. If the radiation were monochromatic, then measurement calculations (for example reconstruction) may be simplified, but it is easier with HHG to produce radiation with several wavelengths. The volume of gas within the gas cell 332 defines an HHG space, although the space need not be completely enclosed and a flow of gas may be used instead of a static volume. The gas may be for example a noble gas such as neon (Ne) or argon (Ar). N2, O2, He, Ar, Kr, Xe gases can all be considered. These are matters of design choice, and may even be selectable options within the same apparatus. Different wavelengths will, for example, provide different levels of contrast when imaging structure of different materials. For inspection of metal structures or silicon structures, for example, different wavelengths may be selected to those used for imaging features of (carbon-based) resist, or for detecting contamination of such different materials. One or more filtering devices 344 may be provided. For example a filter such as a thin membrane of Aluminum (Al) may serve to cut the fundamental IR radiation from passing further into the inspection apparatus. A grating (not shown) may be provided to select one or more specific harmonic wavelengths from among those generated in the gas cell. Some or all of the beam path may be contained within a vacuum environment, bearing in mind that SXR and/or EUV radiation is absorbed when traveling in air. The various components of radiation source 310 and illumination optics 312 can be adjustable to implement different metrology 'recipes' within the same apparatus. For example different wavelengths and/or polarization can be made selectable.

Depending on the materials of the structure under inspection, different wavelengths may offer a desired level of penetration into lower layers. For resolving the smallest device features and defects among the smallest device features, then a short wavelength is likely to be preferred. For example, one or more wavelengths in the range 1-20 nm or optionally in the range 1-10 nm or optionally in the range 10-20 nm may be chosen. Wavelengths shorter than 5 nm suffer from very low critical angle when reflecting off materials typically of interest in semiconductor manufacture. Therefore to choose a wavelength greater than 5 nm will provide stronger signals at higher angles of incidence. On the other hand, if the inspection task is for detecting the presence of a certain material, for example to detect contamination, then wavelengths up to 50 nm could be useful.

From the radiation source 310, the filtered beam 342 enters an inspection chamber 350 where the substrate W including a structure of interest is held for inspection at a measurement position by substrate support 316. The structure of interest is labeled T. The atmosphere within inspection chamber 350 is maintained near vacuum by vacuum pump 352, so that EUV radiation can pass with-out undue attenuation through the atmosphere. The Illumination system 312 has the function of focusing the radiation into a focused beam 356, and may comprise for example a two-dimensionally curved mirror, or a series of one-dimensionally curved mirrors, as described in published US patent application US2017/0184981A1 (which content is incorporated herein by reference in its entirety), mentioned above. The focusing is performed to achieve a round or elliptical spot S under 10 Lm in diameter, when projected onto the structure of interest. Substrate support 316 comprises for example an X-Y translation stage and a rotation stage, by which any part of the substrate W can be brought to the focal point of beam to in a desired orientation. Thus the radiation spot S is formed on the structure of interest. Alternatively, or additionally, substrate support 316 comprises for example a tilting stage that may tilt the substrate W at a certain angle to control the angle of incidence of the focused beam on the structure of interest T.

Optionally, the illumination system 312 provides a reference beam of radiation to a reference detector 314 which may be configured to measure a spectrum and/or intensities of different wavelengths in the filtered beam 342. The reference detector 314 may be configured to generate a signal 315 that is provided to processor 310 and the filter may comprise information about the spectrum of the filtered beam 342 and/or the intensities of the different wavelengths in the filtered beam.

Reflected radiation 360 is captured by detector 318 and a spectrum is provided to processor 320 for use in calculating a property of the target structure T. The illumination system 312 and detection system 318 thus form an inspection apparatus. This inspection apparatus may comprise a soft X-ray and/or EUV spectroscopic reflectometer of the kind described in US2016282282A1 which content is incorporated herein by reference in its entirety.

If the target T has a certain periodicity, the radiation of the focussed beam 356 may be partially diffracted as well. The diffracted radiation 397 follows another path at well-defined angles with respect to the angle of incidence then the reflected radiation 360. In FIG. 4, the drawn diffracted radiation 397 is drawn in a schematic manner and diffracted radiation 397 may follow many other paths than the drawn paths. The inspection apparatus 302 may also comprise further detection systems 398 that detect and/or image at least a portion of the diffracted radiation 397. In FIG. 4 a single further detection system 398 is drawn, but embodiments of the inspection apparatus 302 may also comprise more than one further detection system 398 that are arranged at different position to detect and/or image diffracted radiation 397 at a plurality of diffraction directions. In other words, the (higher) diffraction orders of the focussed radiation beam that impinges on the target T are detected and/or imaged by one or more further detection systems 398. The one or more detection systems 398 generates a signal 399 that is provided to the metrology processor 320. The signal 399 may include information of the diffracted light 397 and/or may include images obtained from the diffracted light 397.

To aid the alignment and focusing of the spot S with desired product structures, inspection apparatus 302 may also provide auxiliary optics using auxiliary radiation under control of metrology processor 320. Metrology processor 320 can also communicate with a position controller 372 which operates the translation stage, rotation and/or tilting stages. Processor 320 receives highly accurate feedback on the position and orientation of the substrate, via sensors. Sensors 374 may include interferometers, for example, which can give accuracy in the region of picometers. In the operation of the inspection apparatus 302, spectrum data 382 captured by detection system 318 is delivered to metrology processing unit 320.

As mentioned an alternative form of inspection apparatus uses soft X-ray and/or EUV radiation at normal incidence or near-normal incidence, for example to perform diffraction-based measurements of asymmetry. Both types of inspection apparatus could be provided in a hybrid metrology system. Performance parameters to be measured can include overlay (OVL), critical dimension (CD), coherent diffraction imaging (CDI) and at-resolution overlay (ARO) metrology. The soft X-ray and/or EUV radiation may for example have wavelengths less than 100 nm, for example using radiation in the range 5-30 nm, of optionally in the range from 10 nm to 20 nm. The radiation may be narrowband or broadband in character. The radiation may have discrete peaks in a specific wavelength band or may have a more continuous character.

Like the optical scatterometer used in today's production facilities, the inspection apparatus 302 can be used to measure structures within the resist material treated within the litho cell (After Develop Inspection or ADI), and/or to measure structures after they have been formed in harder material (After Etch Inspection or AEI). For example, substrates may be inspected using the inspection apparatus 302 after they have been processed by a developing apparatus, etching apparatus, annealing apparatus and/or other apparatus.

Figure 5A:
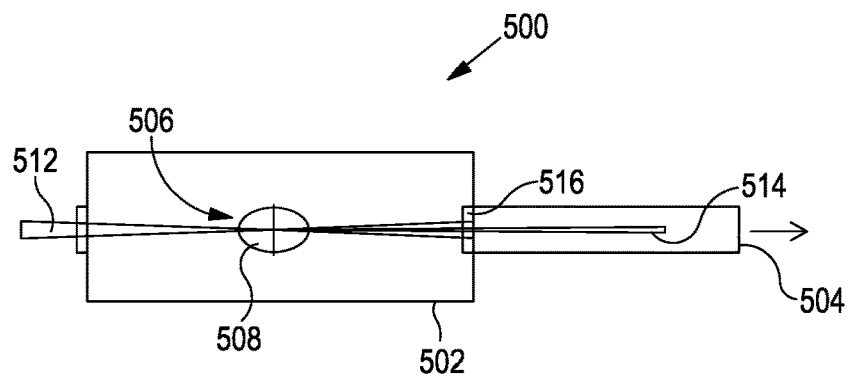
FIG. 5a depicts a schematic representation of an HHG radiation source.

FIG. 5a shows a schematic representation of a radiation source 500 for generation of emitted radiation by HHG. The source 500 comprises a vacuum vessel 502 and a vacuum optical system 504 including the optical column referred to above and directing an emitted beam of radiation onto a substrate. The vacuum vessel 502 comprises an interaction region 506 for receiving a medium 508 for use as a target, such as a gas target. The vacuum vessel 502 comprises a viewport 510 or other inlet to the vacuum vessel 502 through which drive radiation 512 enters the vacuum vessel 502. At the interaction region 506, the drive radiation 512 interacts with the medium 508 to generate emitted radiation 514 by HHG. It can be seen in FIG. 5 that the drive radiation 512 continues to propagate beyond the interaction region 506 in the direction of emission of the emitted radiation 514. For reasons mentioned above, a blocking filter 516 may be used to block at least part of the drive radiation 512 and allow at least part of the emitted radiation 514 to pass. Typically such a filter may attenuate the drive radiation by many orders of magnitude (e.g. only $10^{-11}$ of the incident drive radiation may pass the filter), and typically some tens of percents of the HHG radiation can pass (e.g. 20%).

Figure 5B:
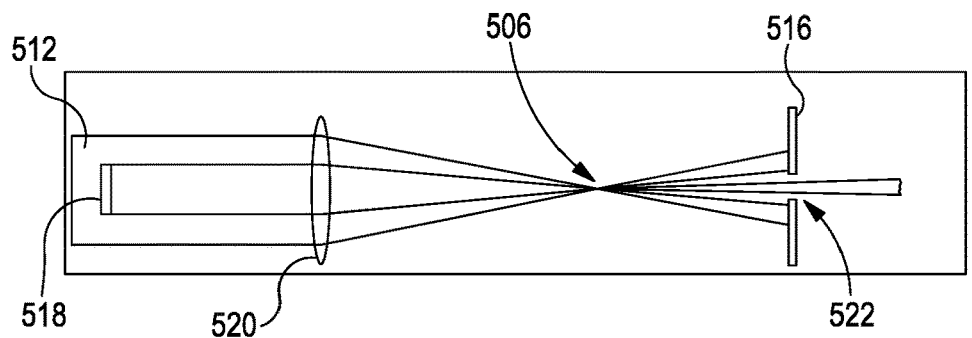
FIG. 5b depicts a schematic representation of an arrangement for use with an HHG radiation source, including a beam block.

FIG. 5b shows an exemplary arrangement for use with the source 500 and for blocking drive radiation 512 to prevent it being emitted from the source 500. The features of FIG. 5b may be combined as appropriate with those of FIG. 5a. The arrangement of FIG. 5b comprises a beam block 518 positioned upstream (i.e. closer to the drive radiation source) of the interaction region 506. The beam block 518 blocks at least part of the drive radiation and in the arrangement of FIG. 5b results in an annular drive radiation beam. The term "annular" in this sense encompasses any shape of beam with an internal area that is blocked. The beam block may be a physical block placed in the propagation path of the drive radiation 512 or may be provided by other arrangements such as a pierced mirror or an axicon pair.

A lens 520 is positioned downstream of the beam block 518 and upstream of the interaction region 506 and is arranged to focus the drive radiation 512 at the interaction region 506. Using such an arrangement, a roughly Gaussian intensity distribution of the drive radiation 512 is seen at the interaction region 506, after which the drive radiation 512 continues to propagate as an annular beam downstream of the interaction region 506. The blocking filter 516 comprises an aperture 522. The aperture 522 is sized to permit a substantial amount of the drive radiation 512 to be blocked and to allow a substantial amount of the emitted radiation 514 to pass through. Typically, the aperture may be selected such that at least 99% or 99.9% of the drive radiation is blocked such that the remaining part is of sufficiently low intensity not to damage any further filter that may be placed downstream. Additionally, it is desirable to limit loss of HHG radiation by the aperture so it may be selected to allow at least some tens of percent to pass through (e.g. 20%).

Figure 6A:
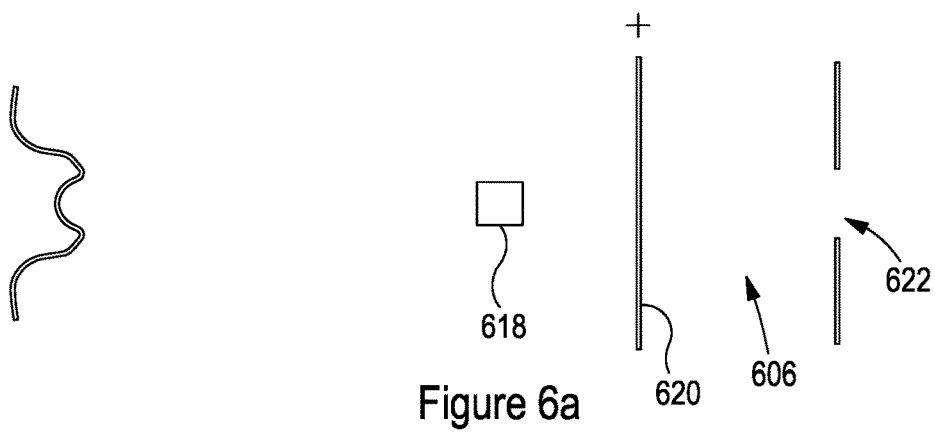
FIG. 6a depicts a schematic representation of an arrangement for use with an HHG radiation source.

FIG. 6a shows a schematic representation of an arrangement for use in a radiation source. The features of FIG. 6a may be combined with those of FIG. 5a as appropriate. The arrangement of FIG. 6a comprises an interaction region 606 that is positioned at an interaction plane and is configured to receive a medium, such as a gas target, for generation of emitted radiation by HHG. The arrangement also comprises a beam block 618 that is positioned upstream from the interaction region 606 at a beam block plane and that is positioned to block at least part of a drive radiation beam (not shown in FIG. 6a), and in specific arrangements to block a central part of the drive radiation beam. The arrangement also comprises a lens 620 that is positioned upstream of the interaction region 606 and downstream of the beam block 618. The arrangement also comprises an aperture 622 positioned downstream of the interaction region 606 at an aperture plane. It is noted here that whilst the aperture plane is substantially perpendicular to the direction of propagation of drive radiation through the source, the aperture 622 itself may be transverse to a direction of propagation of drive radiation through the source. The term "transverse" as used in this context encompasses perpendicular to, but need not be limited to that definition. In exemplary arrangements, the aperture 622 may be angled with respect to the aperture plane to reflect drive radiation away from an axis of propagation of the drive radiation. For example, the aperture may be formed in a mirror that is angled with respect to the axis of propagation. In such arrangements, at least a part of the aperture 622 will be coincident with the aperture plane. As with other arrangements described herein, the aperture 622 is configured to allow at least part of the emitted radiation to pass through and to block at least part of the drive radiation beam. typically an SXR and/or EUV efficient design would permit a significant fraction, say more than 50%, and ideally >90%, to pass through.

Drive laser blocking efficiency may depend on the sensitivity to the drive radiation of the optics, sample and measurements downstream. Typically, this sensitivity is very high, and residual drive radiation passing the block may be many orders smaller than the input beam. Therefore, typically a metallic filter may be used downstream of the blocking aperture to filter out any residual drive radiation passing the aperture. Assuming this situation, the blocking efficiency of the aperture may be set according to the damage threshold of the downstream filter. Typically, such a filter can tolerate no more than 1 W of laser, corresponding to a blocking efficiency of 99% or so.

Note that within this invention, forming an image means that an image plane is positioned within the depth of focus (DOF) of a lens. The definition of forming an image of a beam block is that the distance between the aperture plane and the conjugate plane of the beam block plane is smaller than the depth of focus. The definition of forming an image of the spatial distribution of the drive radiation beam is that the distance between the interaction plane and the conjugate plane of the object plane is smaller than the depth of focus.

The definition of forming a sharp image is that the image plane is the conjugate plane.

In the arrangement of FIG. 6a, the aperture plane is positioned with respect to the beam block plane and the lens 620 such that an image of the beam block is formed at the aperture plane. The beam block plane and the aperture plane are set up such that they may be conjugate planes. This results in the drive radiation beam cross-section having a well-defined hole in the center when arriving at the aperture plane (i.e. the laser beam will be annular at the aperture plane), permitting effective blocking of the drive laser beam by an aperture while transmitting the emitted (e.g. SXR and/or EUV) beam.

As can be seen in FIG. 6a, the arrangement also comprises an object plane. The object plane may be the conjugate plane of the gas target plane, that is, the lens forms a sharp image of the object plane in the gas target plane. In exemplary arrangements (e.g. shown in FIG. 6c) a desired intensity distribution of the drive radiation is formed in the object plane. In other exemplary arrangements (e.g. in FIG. 8) there may not be a real plane where the desired distribution is created and therefore the object plane may not be involved. In some exemplary arrangements and as explained below, the object plane and the interaction plane may also be positioned such that a sharp image of the intensity of the drive radiation at the object plane is formed at the interaction plane, that is, they are conjugate planes.

Figure 6B:
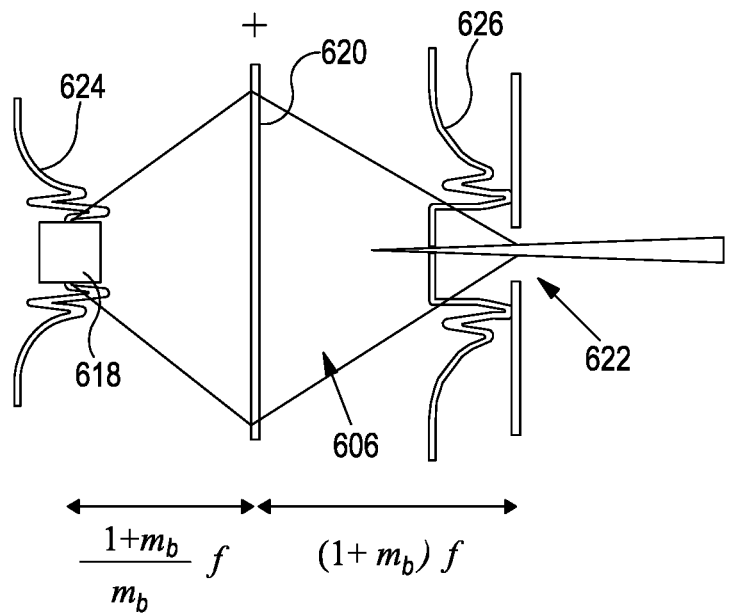
FIG. 6b depicts a schematic representation of an arrangement for use with an HHG radiation source identifying exemplary distances between a beam block plane, a lens and an aperture plane.

FIG. 6b shows a schematic representation of the beam block 618, lens 620, interaction region 606 and aperture 622. The relative distances between the beam block plane and the lens 620, and between the lens 620 and the aperture plane may be calculated using the equations $$d_{block-lens} = \frac{1+m_b}{m_b}f$$

$$d_{lens-aperture} = (1+m_b)f$$

Where $m_b$ is the magnification factor of the beam block to the image of the beam block provided by the lens 620 and f is the focal length of the lens 620.

The drive radiation intensity distributions at both the beam block plane 624 and the aperture plane 626 are shown in FIG. 6b and show that the intensity is zero in a central region of the drive radiation 626 at the aperture plane.

Figure 6C:
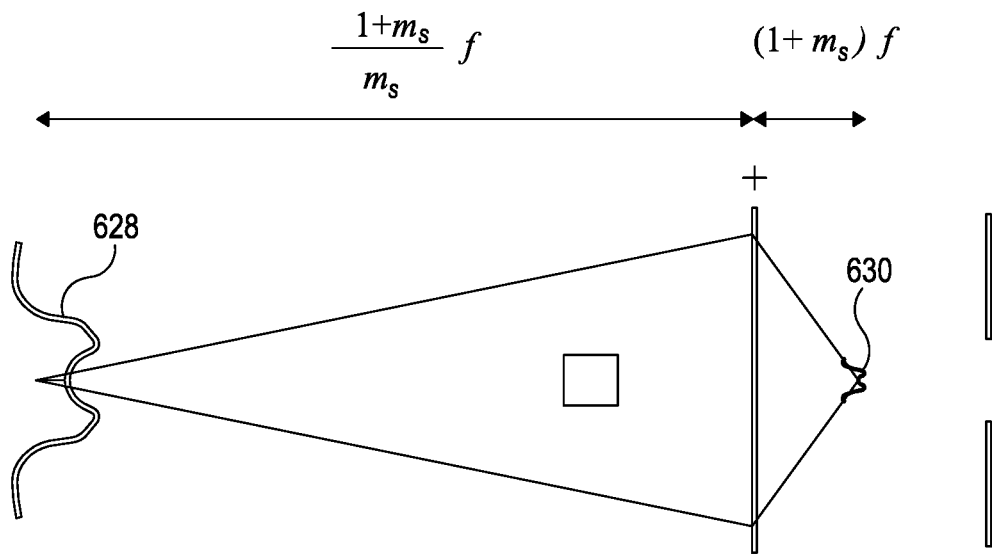
FIG. 6c depicts a schematic representation of an arrangement for use with an HHG radiation source identifying exemplary distances between an object plane, a lens and an interaction plane.

As mentioned above, in some exemplary arrangements, the object plane and the interaction plane are also conjugate planes, resulting in the drive radiation having a desired intensity distribution at the object plane 628 being imaged at the interaction plane 630. This is shown in FIG. 6c and the relative distances between the object plane and the lens 620, and between the lens 620 and the interaction plane may be calculated using the equations $$d_{obj-lens} = \frac{1+m_s}{m_s}f$$

$$d_{lens-inter} = (1+m_s)f$$

Where $m_s$ is the magnification factor of the object plane to the image of the object plane provided by the lens 620 and f is the focal length of the lens 620.

Such arrangements can ensure that, in addition to the beam block plane being imaged at the aperture plane, the object plane (having the correct intensity distribution of the drive radiation) is imaged at the interaction plane. In some such exemplary arrangements, the image of the object plane may be decoupled from the image of the beam block plane such that they do not interfere with each other, or at least that they interfere with each other sufficiently little that operation of the source is not adversely affected. The term "decoupled" in this context may encompass a situation where the presence of the beam block does not appreciably influence the intensity distribution of the drive radiation at the target plane and the presence of a non-Gaussian beam at the object plane does not appreciably influence the intensity distribution of the drive radiation at the aperture plane.

In exemplary arrangements, the dimensions of the beam block 618 at the beam block plane relative to the dimensions of the drive radiation at the beam block plane may be configured to ensure that an image of the beam block 618 does not appear at the interaction region. In some exemplary arrangements, the dimensions of the beam block 618 may be at least 20% less, at least 40% less, at least 50% less or at least 70% less than the corresponding dimensions of the drive radiation beam. Further, in exemplary arrangements, the dimensions of the beam block 618 may be from 10% to 70% less or 20% to 60% less or 30% to 50% less than the corresponding dimensions of the drive radiation beam.

In other exemplary arrangements, the dimensions of the beam block 618 and the drive radiation at the beam block plane may be configured to achieve a Strehl ratio of 0.8 or more. In arrangements where the drive radiation beam and the beam block 618 has a circular cross section, the dimensions mentioned above may be diameters.

Decoupling may also be defined in terms of a depth of focus (DOF) of one or both of the image of the beam block at the aperture plane and the image of the drive radiation beam at the interaction plane. DOF in this context may be defined as a range of distances from a lens at which a image may be formed, which is explained in greater detail below.

For the purposes of the methods and apparatus disclosed herein, the interaction plane may be positioned outside of the DOF of the beam block image. That is, the aperture plane, which in some exemplary arrangements is coincident with a centre of the DOF of the beam block image, may be sufficiently distanced from the interaction plane so that the interaction plane falls outside the DOF of the beam block image. No image of the beam block is formed at the interaction plane.

Similarly, the aperture plane may be positioned such that it is outside of the DOF of the image of the drive radiation intensity distribution formed at the interaction plane. That is, the interaction plane, which in some exemplary arrangements is coincident with a centre of the DOF of the image of the drive radiation intensity distribution, may be sufficiently distanced from the aperture plane so that the aperture plane falls outside the DOF of the image of the drive radiation intensity distribution. No image of the drive radiation intensity distribution at the object plane is formed at the aperture plane.

Figure 7:
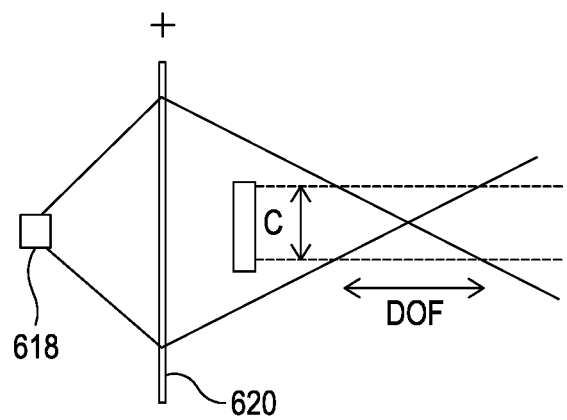
FIG. 7 depicts a schematic representation of an arrangement for use with an HHG radiation source and illustrating a depth of field of a beam block image.

FIG. 7 shows a schematic demonstrating the principle of DOF. As can be seen, rays of radiation emanating from the beam block 618 are focussed by the lens 620 to a point that is coincident with the aperture plane. This point is the point at which the image of the beam block 618 may be in sharp focus and may be the center of the DOF. At positions upstream and downstream of the center of the DOF, the image of the beam block 618 is out of focus to a degree that increases with distance away from the center of the DOF. At these positions away from the center of the DOF, the rays of radiation from the beam block 618 are distributed over a blurred spot, which is termed a circle of confusion.

The DOF of the beam block image is the distance either side of the aperture plane within which the circle of confusion is less than or equal to a maximum diameter, c. The diameter, c, may be set at a size whereby the beam block image is blurred all over the relevant radial domain. The interaction plane may be positioned at a distance further from the aperture plane than would result in a circle of confusion of diameter, c, outside of the DOF. That is, at the gas target plane, the circle of confusion should be larger than the size of the field distribution in the gas target plane, which is usually several tens of um. Half the DOF should be smaller than the distance between the gas target plane and aperture plane.

The DOF may be calculated using the following formula $$DOF = 2cN(1+m)$$

Where N is the ratio of focal length to beam diameter at the lens 620 (typically around 100), and m is the magnification of the beam block image by the lens 620 (typically around 1). Using those typical figures and assuming c=30 µm, the DOF is approximately 10 mm. The features of the arrangements disclosed herein may be configured such that the DOF of the beam block image is in a range from 7 mm to 13 mm, from 8 mm to 12 mm and in specific examples from 10 mm to 11 mm. In some arrangements, the diameter, c, of the circle of confusion of the beam block image is 35 µm or less or 30 µm or less.

Exemplary arrangements for use in a radiation source may comprise a beam shaper. The beam shaper may be any apparatus capable of controlling an intensity distribution of the drive radiation, which may be produced by a laser as discussed above. Examples of a beam shaper include a spatial light modulator (SLM), a flattop beam shaper and a deformable mirror. The beam shaper may be placed significantly closer to the beam block than a real object plane, so that the overall system size may be significantly reduced. The beam shaper may be used to generate the drive radiation beam having a desired intensity distribution at the object plane. In other arrangements, the beam shaper may also provide a desired intensity distribution at any other plane upstream of the beam block. In exemplary arrangements using a beam shaper there may not be a real object plane left of the lens in which the desired distribution at the target plane is reproduced and in such circumstances the object plane may be considered a virtual object plane.

Figure 8:
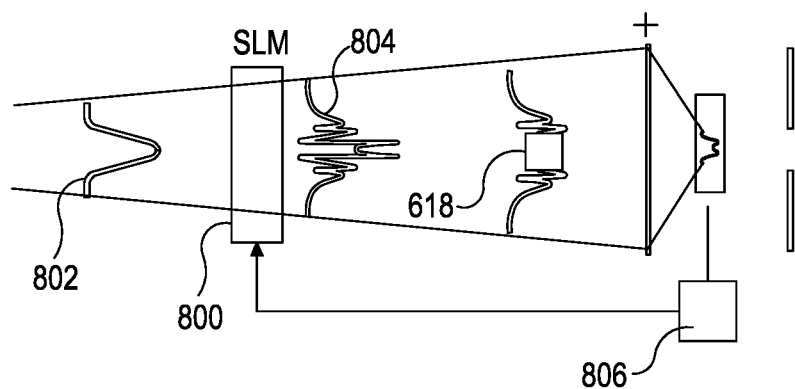
FIG. 8 depicts a schematic representation of an arrangement for use with an HHG radiation source including a beam shaper.

FIG. 8 shows an exemplary arrangement for use with a radiation source in which a beam shaper 800 is positioned upstream of the beam block 618. The beam shaper 800 receives drive radiation 802 from a drive radiation source (not shown) and having, for example, a broadly Gaussian intensity distribution and generates drive radiation 804 having a specific intensity distribution. The arrangement also includes a sensor and a feedback controller 806. The sensor senses the intensity distribution of the drive radiation at the interaction plane and passes it to the feedback controller 806. The feedback controller 806 sends data relating to the sensed intensity distribution to the beam shaper 804, which controls the intensity distribution it outputs based thereon. In an embodiment, a 1% beam splitter is used to project a portion of the drive radiation towards a CCD camera which acts as the above indicated sensor. The position of such a beam splitter may be, seen in the transmission direction of the drive radiation, just before or just after the lens.

The arrangement of FIG. 8 may include one or more features of arrangements disclosed above and may be combined with as appropriate with features of FIG. 5a.

Figure 9:
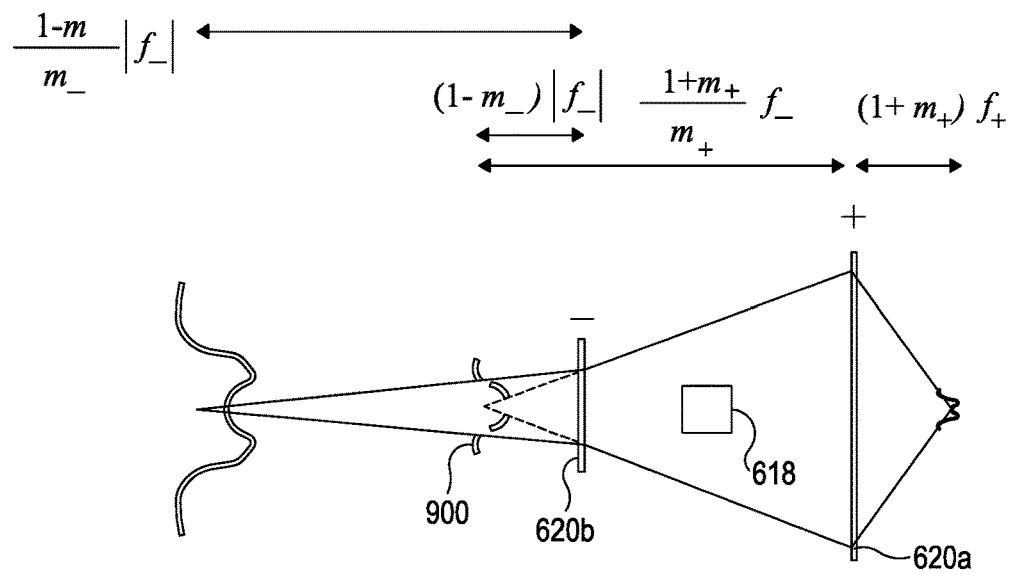
FIG. 9 depicts a schematic representation of an arrangement for use with an HHG radiation source comprising two lenses.

FIG. 9 shows an exemplary arrangement comprising two lenses 620a, 620b. This allows the overall length of the system to be reduced. FIG. 9 may also include one or more of the features disclosed in respect of other arrangements above and/or may be combined as appropriate with features of FIG. 5a.

The two lens system of FIG. 9 provides no intermediate focus of the drive radiation as this would lead to drive radiation beam deterioration due to ionization of air. The second lens 620b is a negative lens forming a virtual intermediate image 900 rather than real intermediate image of the intensity distribution of the drive radiation of the object plane. The second lens 620b is a negative lens. The second lens 620b is upstream of the beam block 618.

The distance of the second lens 620b from the object plane can be determined by the equation $$d_{obj-lens2} = \frac{1-m_-}{m_-}|f_-|$$

Where $m_-$ is the magnification of the image of the intensity of the drive radiation beam by the second lens 620b and $f_-$ is the focal length of the second lens 620b. The distance of the second lens 620b from the virtual intermediate image 900 can be determined by the equation $$d_{lens2-virtual} = (1-m_-)|f_-|$$

The distance of the first lens 620a from the virtual intermediate image 900 can be determined by the equation $$d_{virtual-lens1} = \frac{1+m_+}{m_+}|f_+|$$

Where $m_+$ is the magnification of the virtual image 900 of the intensity of the drive radiation beam by the first lens 620a and $f_+$ is the focal length of the first lens 620a. The distance of the first lens 620a from the virtual intermediate image 900 can be determined by the equation $$d_{lens1-inter} = (1+m_+)f_+$$

Figure 10:
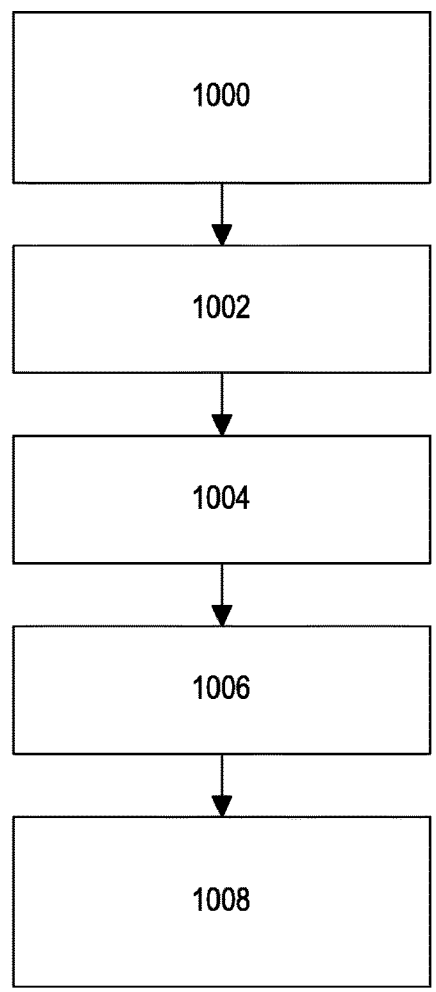
FIG. 10 shows a flow diagram for a method of causing an interaction between a drive radiation beam and a medium, for generation of emitted radiation by high harmonic generation.

FIG. 10 shows a flow diagram of a method for causing an interaction between a drive radiation beam and a medium, for generation of emitted radiation by high harmonic generation.

Drive radiation generated by a drive radiation source such as a laser and is propagated 1000 into a vacuum vessel, such as that shown in FIG. 5a. At least part of the drive radiation is blocked 1002 by a beam block 618. The beam block 618 may be as described above or of any other form known to the skilled person. The drive radiation that is partially blocked propagates through a lens 1004 that focusses it onto the interaction plane. The focussed drive radiation impinges 1006 on a medium, such as a gas target that is positioned downstream of the beam block and the lens. The lens also focusses drive radiation emanating from the beam block 618 at the aperture plane positioned downstream of the interaction plane such that an image of the beam block 618 is formed at the aperture plane.

Further embodiments are defined in the subsequent numbered clauses:

1. A radiation source arrangement operable to cause an interaction between a drive radiation beam and a medium for generation of emitted radiation by high harmonic generation, the arrangement comprising:
   an interaction region positioned at an interaction plane and configured to receive the medium;
   a beam block positioned upstream of the interaction plane at a beam block plane and configured to partially block the drive radiation beam; and
   a beam shaper positioned upstream of the beam block plane at an object plane and configured to control a spatial distribution of the drive radiation beam.

2. The arrangement according to clause 1, wherein at least one lens is positioned upstream of the interaction plane and downstream of the beam block plane, wherein the lens is positioned such that an image of the spatial distribution of the drive radiation beam is formed at the interaction plane.

3. The arrangement according to clause 1 or 2, wherein the lens is positioned such that the object plane and the interaction plane are conjugate planes.

4. The arrangement according to any preceding clause, wherein an aperture is positioned downstream of the interaction plane at an aperture plane and configured to allow at least part of the emitted radiation to pass through and to block at least part of the drive radiation beam, wherein the aperture plane is positioned with respect to the beam block plane and the lens such that an image of the beam block is formed at the aperture plane.

5. The arrangement according to clause 4, wherein the lens is positioned such that the beam block plane and the aperture plane are conjugate planes.

6. The arrangement according to clause 4 or 5, wherein a dimension of the beam block in the beam block plane relative to a dimension of the drive radiation beam in the beam block plane is such that the image of the beam block and the image of the spatial distribution of the drive radiation beam are decoupled.

7. The arrangement according to clause 6, wherein the dimension of the beam block in the beam block plane is 30% or less of the dimension of the drive radiation beam in the beam block plane.

8. The arrangement according to clause 7, wherein the beam block and the drive radiation beam have substantially circular cross sections in the beam block plane, and wherein the dimensions of the beam block and the drive radiation beam are diameters.

9. The arrangement according to any preceding clause, wherein a depth of focus of the image of the beam block does not overlap the interaction plane.

10. The arrangement according to clause 9, wherein a centre of the depth of focus of the image of the beam block is substantially coincident with the aperture plane.

11. The arrangement according to clause 9 or 10 when dependent directly or indirectly on clause 4, wherein a circle of confusion associated with the depth of focus of the image of the beam block is larger than the image of the drive radiation beam at the interaction plane.

12. The arrangement according to clause 11, wherein the depth of focus of the image of the beam block has a maximum circle of confusion having a diameter of 35 μm or less.

13. The arrangement according to any preceding clause, wherein a depth of focus of the image of the spatial distribution of the drive radiation beam does not overlap the aperture plane.

14. The arrangement according to clause 13, wherein a centre of the depth of focus of the image of the intensity distribution of the drive radiation beam is substantially coincident with the interaction plane.

15. The arrangement according to any of clauses 9 to 14, wherein the depth of focus of the image of the beam block and/or the depth of focus of the image of the spatial distribution of the drive radiation beam is determined by Depth of focus=$2cN(1+m)$ where c is a maximum circle of confusion, N is a ratio of focal length of the lens to a diameter of the drive radiation beam at the lens and m is a magnification factor of the image of the beam block at the aperture plane.

16. The arrangement according to any of clauses 4 to 15 when dependent directly or indirectly on clause 3, wherein the beam shaper comprises a spatial light modulator positioned at the object plane.

17. The arrangement of clause 16, further comprising a sensor configured to detect a spatial profile of the drive radiation beam at the interaction plane; and a feedback controller configured to feedback data relating to the detected spatial profile of the drive radiation beam to the spatial light modulator, wherein the spatial light modulator is configured to control the spatial profile of the drive radiation beam based on the data fed back.

18. A metrology apparatus comprising the arrangement according to any preceding clause.

19. A lithographic cell comprising the arrangement according to any preceding clause or the metrology apparatus according to clause 18.

20. A method of causing an interaction between a drive radiation beam and a medium, for generation of emitted radiation by high harmonic generation, the method comprising:
    blocking the drive radiation beam by a beam block such that at least part of the drive radiation beam is blocked;
    propagating the drive radiation beam through at least one lens positioned downstream of the beam block;
    impinging the drive radiation beam on an interaction region comprising the medium and positioned downstream of the beam block; and
    focussing the drive radiation at an aperture positioned downstream of the interaction region at an aperture plane such that an image of the beam block is formed at the aperture plane, the aperture being configured to allow at least part of the emitted radiation to pass through and to block at least part of the drive radiation beam.

In the context of this document the term HHG or HHG source is introduced. HHG refers to High Harmonic Generation, sometimes referred to as high order harmonic generation. HHG is a non-linear process in which a target, for example a gas, a plasma or a solid sample, is illuminated at an interaction region by an intensive laser pulse of drive radiation. Subsequently, the target may emit radiation with a frequency that is a multiple of the frequency of the drive radiation of the laser pulse. Such frequency, that is a multiple, is called a harmonic of the radiation of the laser pulse. One may define that the generated HHG radiation is a harmonic above the fifth harmonic and these harmonics are termed high harmonics.

The physical process that forms a basis of the HHG process is different from the physical process that relates to generating radiation of the lower harmonics, typically the $2^{nd}$ to $5^{th}$ harmonic. The generation of radiation of the lower harmonic relates to perturbation theory. The trajectory of the (bound) electron of an atom in the target is substantially determined by the Coulomb potential of the host ion.

In HHG, the trajectory of the electron that contributes to the HHG process is substantially determined by the electric field of the incoming drive laser light. In the so-called "three step model" describing HHG, electrons tunnel through the Coulomb barrier which is at that moment substantially suppressed by the laser field (step 1), follow a trajectory determined by the laser field (step 2) and recombine with a certain probability while releasing their kinetic energy plus the ionization energy in the form of radiation (step 3). Another way of phrasing a difference between HHG and the generation of radiation of the lower harmonic is to define that all radiation with photon energy above the ionization energy of the target atoms as "High Harmonic" radiation, e.g. HHG generated radiation, and all radiation with photon energy below the ionization energy as non-HHG generated radiation. If Neon is used as a gas target, all radiation with a wavelength shorter than 62 nm (having a photon energy higher than 20.18 eV) is generated by means of the HHG process. For Argon as a gas target, all radiation having a photon energy higher than about 15.8 eV is generated by means of the HHG process.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference is made to "metrology apparatus/tool/system" or "inspection apparatus/tool/system", these terms may refer to the same or similar types of tools, apparatuses or systems. E.g. the inspection or metrology apparatus that comprises an embodiment of the invention may be used to determine characteristics of structures on a substrate or on a wafer. E.g. the inspection apparatus or metrology apparatus that comprises an embodiment of the invention may be used to detect defects of a substrate or defects of structures on a substrate or on a wafer. In such an embodiment, a characteristic of interest of the structure on the substrate may relate to defects in the structure, the absence of a specific part of the structure, or the presence of an unwanted structure on the substrate or on the wafer.

Although specific reference may have been made above to the use of embodiments of the invention in the context of optical lithography, it will be appreciated that the invention, where the context allows, is not limited to optical lithography and may be used in other applications, for example imprint lithography.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A radiation source arrangement operable to cause an interaction between a drive radiation beam and a medium for generation of emitted radiation by high harmonic generation, the arrangement comprising:
    an interaction region positioned at an interaction plane and configured to receive the medium;
    a beam block positioned upstream of the interaction plane at a beam block plane and configured to partially block the drive radiation beam;
    a beam shaper positioned upstream of the beam block plane at an object plane and configured to control a spatial distribution of the drive radiation beam; and
    at least one lens positioned upstream of the interaction plane and downstream of the beam block plane, wherein the lens being positioned such that an image of the spatial distribution of the drive radiation beam is formed at the interaction plane,
    wherein the beam shaper comprises a spatial light modulator (SLM), a flattop beam shaper, a deformable mirror, or a combination thereof, and wherein the beam shaper is configured to control the spatial distribution of the drive radiation beam such that the drive radiation beam is a non-Gaussian beam at the object plane.

2. The arrangement of claim 1, wherein the lens is positioned such that the object plane and the interaction plane are conjugate planes.

3. The arrangement of claim 1, wherein an aperture is positioned downstream of the interaction plane at an aperture plane and configured to allow at least part of the emitted radiation to pass through and to block at least part of the drive radiation beam, wherein the aperture plane is positioned with respect to the beam block plane and the lens such that an image of the beam block is formed at the aperture plane.

4. The arrangement of claim 3, wherein the lens is positioned such that the beam block plane and the aperture plane are conjugate planes.

5. The arrangement of claim 3, wherein a dimension of the beam block in the beam block plane relative to a dimension of the drive radiation beam in the beam block plane is such that the image of the beam block and the image of the spatial distribution of the drive radiation beam are decoupled.

6. The arrangement of claim 5, wherein the dimension of the beam block in the beam block plane is 30% or less of the dimension of the drive radiation beam in the beam block plane.

7. The arrangement of claim 6, wherein the beam block and the drive radiation beam have substantially circular cross sections in the beam block plane, and wherein the dimensions of the beam block and the drive radiation beam are diameters.

8. The arrangement of claim 3, wherein a depth of focus of the image of the beam block does not overlap the interaction plane.

9. The arrangement of claim 8, wherein a center of the depth of focus of the image of the beam block is substantially coincident with the aperture plane.

10. The arrangement of claim 8, wherein a circle of confusion associated with the depth of focus of the image of the beam block is larger than the image of the drive radiation beam at the interaction plane.

11. The arrangement of claim 10, wherein the depth of focus of the image of the beam block has a maximum circle of confusion having a diameter of 35 µm or less.

12. The arrangement of claim 1, wherein a depth of focus of the image of the spatial distribution of the drive radiation beam does not overlap an aperture plane of an aperture positioned downstream of the interaction plane.

13. The arrangement of claim 12, wherein a center of the depth of focus of the image of the spatial distribution of the drive radiation beam is substantially coincident with the interaction plane.

14. The arrangement of claim 8, wherein at least one of the depth of focus of the image of the beam block and the depth of focus of the image of the spatial distribution of the drive radiation beam is determined by $$\text{Depth of focus} = 2cN(1+m)$$

where c is a maximum circle of confusion, N is a ratio of focal length of the lens to a diameter of the drive radiation beam at the lens, and m is a magnification factor of the image of the beam block at the aperture plane.

15. The arrangement of claim 1, further comprising a sensor configured to detect a spatial profile of the drive radiation beam at the interaction plane; and a feedback controller configured to feedback data relating to the detected spatial profile of the drive radiation beam to the beam shaper, wherein the beam shaper is configured to control the spatial profile of the drive radiation beam based on the data fed back.

16. A metrology apparatus comprising:
an arrangement operable to cause an interaction between a drive radiation beam and a medium for generation of emitted radiation by high harmonic generation, the arrangement comprising:
an interaction region positioned at an interaction plane and configured to receive the medium;
a beam block positioned upstream of the interaction plane at a beam block plane and configured to partially block the drive radiation beam;
a beam shaper positioned upstream of the beam block plane at an object plane and configured to control a spatial distribution of the drive radiation beam; and
at least one lens positioned upstream of the interaction plane and downstream of the beam block plane, wherein the lens being positioned such that an image of the spatial distribution of the drive radiation beam is formed at the interaction plane,
wherein the beam shaper comprises a spatial light modulator (SLM), a flattop beam shaper, a deformable mirror, or a combination thereof, and
wherein the beam shaper is configured to control the spatial distribution of the drive radiation beam such that the drive radiation beam is a non-Gaussian beam at the object plane.

17. A lithographic cell comprising the metrology apparatus according to claim 16.

18. A method of causing an interaction between a drive radiation beam and a medium, for generation of emitted radiation by high harmonic generation, the method comprising:
shaping the drive radiation beam with a beam shaper to control a spatial distribution of the drive radiation beam, wherein the beam shaper comprises a spatial light modulator (SLM), a flattop beam shaper, a deformable mirror, or a combination thereof, and wherein the beam shaper is configured to control the spatial distribution of the drive radiation beam such that the drive radiation beam is a non-Gaussian beam at the object plane;
blocking the drive radiation beam with a beam block positioned downstream of the beam shaper such that at least part of the drive radiation beam is blocked;
propagating the drive radiation beam through at least one lens positioned downstream of the beam block;
impinging the drive radiation beam on an interaction region comprising the medium and positioned downstream of the beam block; and
focusing the drive radiation at an aperture positioned downstream of the interaction region at an aperture plane such that an image of the beam block is formed at the aperture plane, the aperture being configured to allow at least part of the emitted radiation to pass through and to block at least part of the drive radiation beam.

19. A radiation source arrangement operable to cause an interaction between a drive radiation beam and a medium for generation of emitted radiation by high harmonic generation, the arrangement comprising:
an interaction region positioned at an interaction plane and configured to receive the medium;

a beam block positioned upstream of the interaction plane at a beam block plane and configured to partially block the drive radiation beam;

a beam shaper positioned upstream of the beam block plane at an object plane and configured to control a spatial distribution of the drive radiation beam; and at least one lens positioned upstream of the interaction plane and downstream of the beam block plane, wherein the lens being positioned such that an image of the spatial distribution of the drive radiation beam is formed at the interaction plane, wherein the beam shaper is configured to control the spatial distribution of the drive radiation beam such that the drive radiation beam is a non-Gaussian beam at the object plane.

* * * * *